United States Patent
Ching, Jr. et al.

(10) Patent No.: US 9,190,353 B2
(45) Date of Patent: Nov. 17, 2015

(54) LEAD FRAME AND SUBSTRATE SEMICONDUCTOR PACKAGE

(71) Applicants: Mariano Layson Ching, Jr., Tianjin (CN); Allen M. Descartin, Lapulapu (PL); Bo Li, Tianjin (CN)

(72) Inventors: Mariano Layson Ching, Jr., Tianjin (CN); Allen M. Descartin, Lapulapu (PL); Bo Li, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 55 days.

(21) Appl. No.: 14/142,924

(22) Filed: Dec. 30, 2013

(65) Prior Publication Data

US 2014/0252581 A1   Sep. 11, 2014

(30) Foreign Application Priority Data

Mar. 5, 2013 (CN) .......................... 2013 1 0150287

(51) Int. Cl.
*H01L 23/495* (2006.01)
*H01L 23/31* (2006.01)

(52) U.S. Cl.
CPC .... *H01L 23/49575* (2013.01); *H01L 23/49503* (2013.01); *H01L 23/49531* (2013.01); *H01L 23/3107* (2013.01); *H01L 2224/32225* (2013.01); *H01L 2224/48091* (2013.01); *H01L 2224/48227* (2013.01); *H01L 2224/48247* (2013.01); *H01L 2224/49109* (2013.01)

(58) Field of Classification Search
CPC ................... H01L 23/49575; H01L 23/49503; H01L 23/49517; H01L 23/3107
See application file for complete search history.

(56) References Cited

U.S. PATENT DOCUMENTS

| | | | |
|---|---|---|---|
| 5,012,386 A | 4/1991 | McShane | |
| 5,252,784 A | 10/1993 | Asai | |
| 5,818,105 A | 10/1998 | Kouda | |
| 6,201,186 B1* | 3/2001 | Daniels et al. | 174/529 |
| 6,268,660 B1* | 7/2001 | Dhong et al. | 257/774 |
| 6,303,977 B1* | 10/2001 | Schroen et al. | 257/635 |
| 6,440,779 B1* | 8/2002 | Chiu et al. | 438/123 |
| 6,737,750 B1* | 5/2004 | Hoffman et al. | 257/777 |
| 6,894,400 B1* | 5/2005 | Goodelle et al. | 257/795 |
| 8,097,963 B1* | 1/2012 | Cate et al. | 257/786 |
| 8,304,887 B2 | 11/2012 | Lee et al. | |
| 2002/0088632 A1* | 7/2002 | Salatino et al. | 174/52.1 |
| 2004/0065945 A1* | 4/2004 | Smith | 257/666 |

(Continued)

OTHER PUBLICATIONS

Hashemi et al., "A mixed solder grid array and peripheral leaded MCM package", IEEE (2003): pp. 141-146.*

(Continued)

*Primary Examiner* — Michele Fan
(74) *Attorney, Agent, or Firm* — Charles Bergere

(57) ABSTRACT

A semiconductor chip package includes a lead frame having a die paddle, leads surrounding the paddle and a central window through the paddle. A substrate has a base side and a superior side. A peripheral portion of the base side is secured to the paddle and a central portion of the base side is exposed through the central window. A semiconductor chip is secured to the superior side of the substrate. The semiconductor chip is electrically connected to the plurality of leads and the substrate. A mold compound covers at least portions of the lead frame, the substrate and the semiconductor chip. The chip package can be electrically connected to other devices or a circuit board by way of the leads and BGA pads of the substrate exposed in the central window.

9 Claims, 6 Drawing Sheets

(56) References Cited

U.S. PATENT DOCUMENTS

2007/0096160 A1    5/2007  Beroz
2007/0164411 A1*   7/2007  Huang et al. .................. 257/678
2009/0243064 A1*  10/2009  Camacho et al. ............. 257/680
2012/0061821 A1*   3/2012  Black et al. ................... 257/737

OTHER PUBLICATIONS

Hassan Hashemi, Mike Olla, Deborah Cobb, Mike McShane, George Hawkins and Paul Lin, "A Mixed Solder Grid Array Package and Peripheral Leaded MCM Package," 1993 Japan Int'l Electronics Manufacturing Technology Symposium, pp. 141-146, 1993.

* cited by examiner

LEAD FRAME AND SUBSTRATE SEMICONDUCTOR PACKAGE

BACKGROUND OF THE INVENTION

The present invention is directed to a semiconductor package and, more particularly, to a lead frame and substrate based multi-chip module.

Semiconductor device packaging fulfills basic functions such as providing electric connections and protecting the die or chip against mechanical and environmental stresses. Continuing progress in reduction of the size of semiconductor dies allows for reducing package size. However, the increased functionality and complexity of the circuits integrated in the dies requires increased external connections, which increases the complexity of reducing the package size.

Semiconductor dies typically are encapsulated for surface mounting. Such surface mount devices often include more than one embedded or encapsulated die. The electrical contacts for connection with external circuits are exposed on either the sides and/or the bottom of the package and connected internally with electrical contact pads on the semiconductor die. The contacts of the exposed device may be a ball grid array (BGA) or a land grid array (LGA), for example. Various techniques are available for connecting the exposed electrical contacts of the package with the internal contacts of the embedded semiconductor die.

Minimum values are specified for the size of the individual exposed electrical contact surfaces of the device and for the spacing between adjacent electrical contact surfaces. Such specifications necessitate a compromise between the overall size of the packaged device and the number of individual electrical contact surfaces.

It is desirable to have a high density input/output package. It also is desirable to design and construct a package using available techniques that is able to increase inputs and outputs for a leaded package platform on a single package footprint.

BRIEF DESCRIPTION OF THE SEVERAL VIEWS OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. In the drawings.

DETAILED DESCRIPTION OF THE INVENTION

Figure 1:
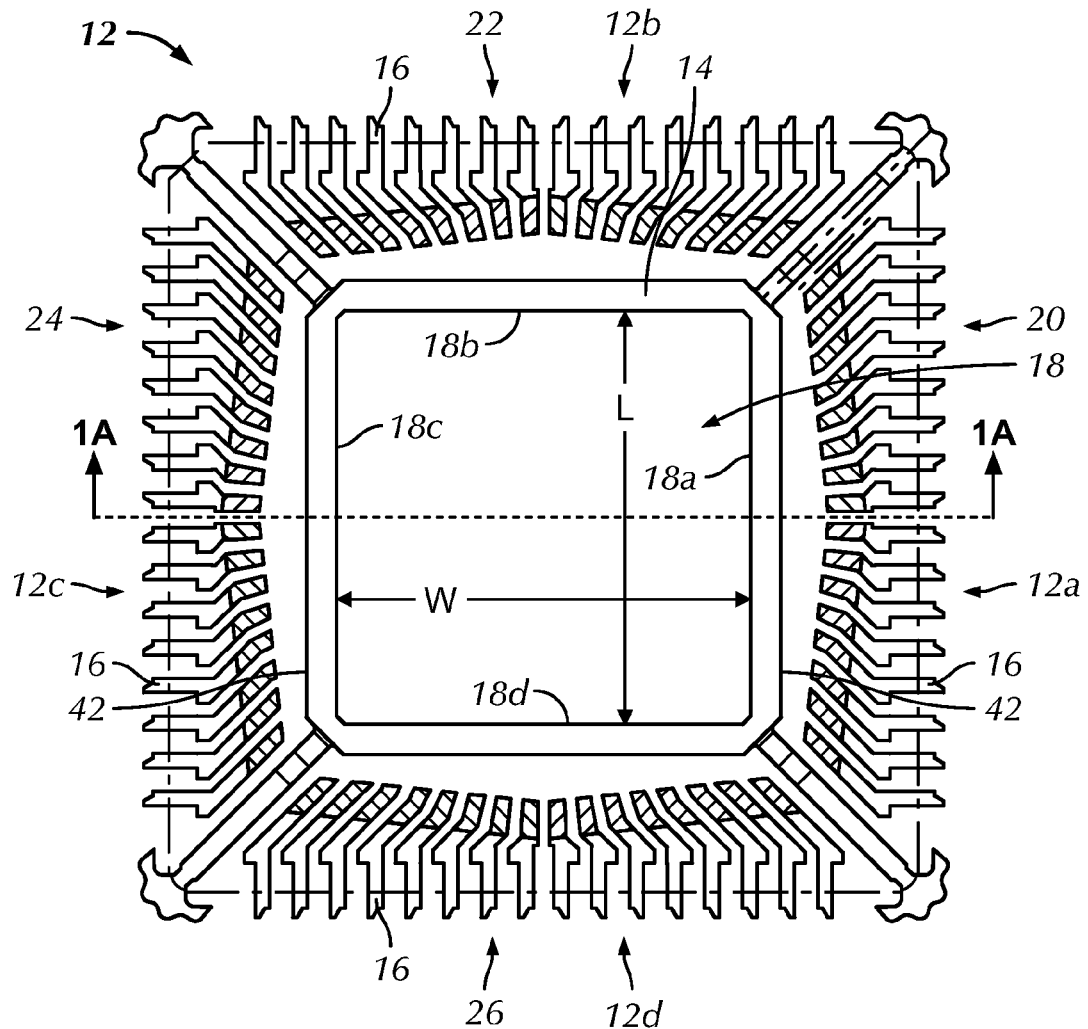
FIG. 1 is a top plan view of a lead frame in accordance with a preferred embodiment of the present invention.
Figure 1A:
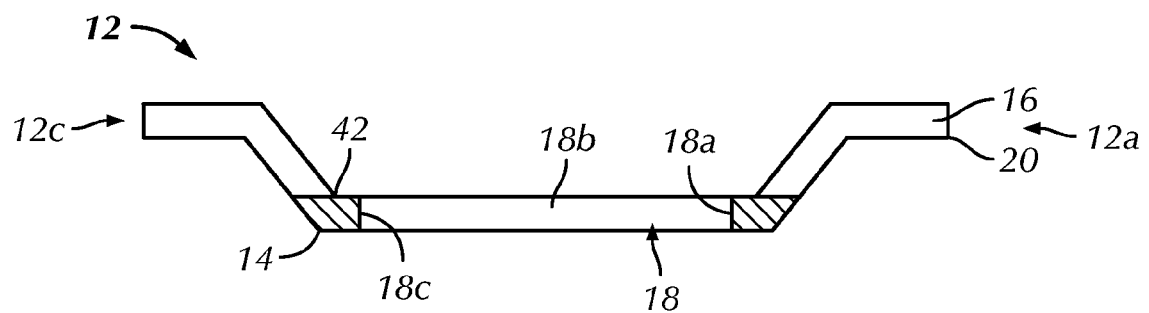
FIG. 1A is a cross-sectional view of the lead frame taken along line 1A-1A of FIG. 1.
Figure 2A:
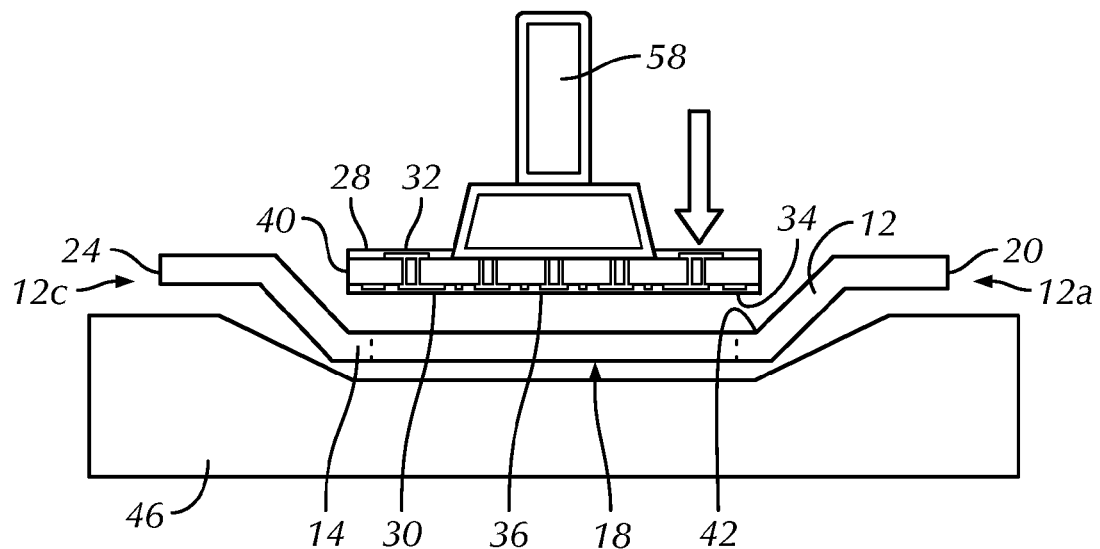
FIG. 2A is a front elevational view of a preferred substrate positioned proximate to the lead frame of FIG. 1 in accordance with a first preferred embodiment, wherein a mechanism positions the substrate relative to the lead frame.
Figure 2B:
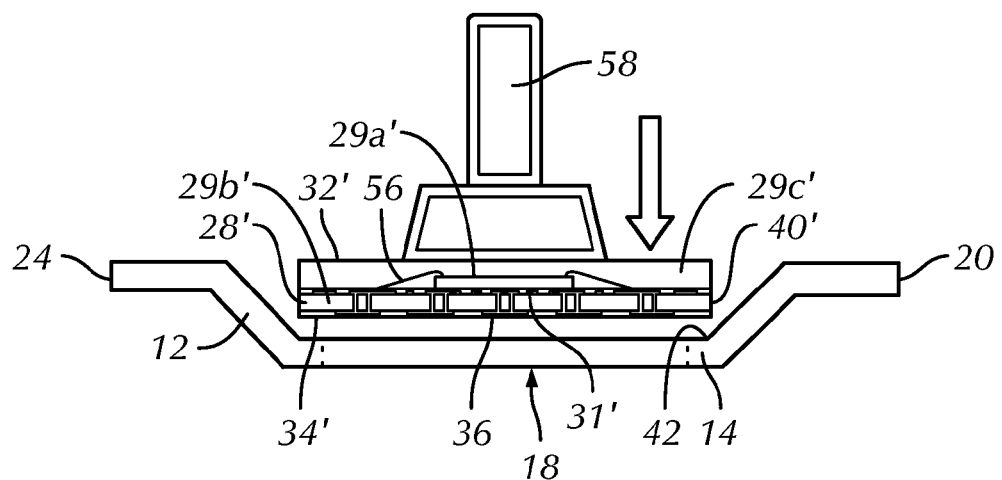
FIG. 2B is a front elevational view of a preferred substrate package positioned proximate to the lead frame of FIG. 1 in accordance with a second preferred embodiment, wherein a mechanism positions the substrate package relative to the lead frame.
Figure 3:
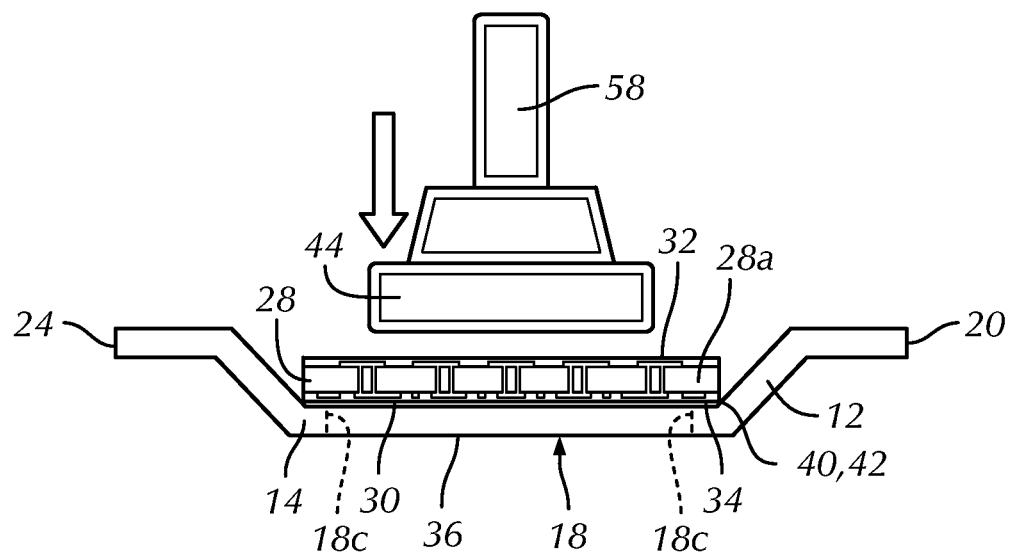
FIG. 3 is a front elevational view of a semiconductor chip being assembled with the substrate and lead frame of FIG. 2A in accordance with the first preferred embodiment, wherein a mechanism positions the chip relative to the lead frame and the substrate.
Figure 4:
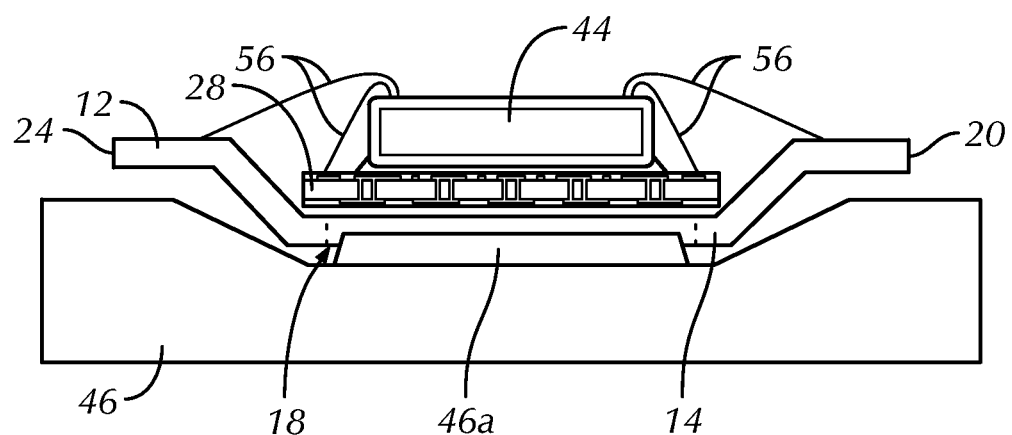
FIG. 4 is a front elevational view of the assembly of FIG. 3, wherein the chip is wire bonded to the substrate and a wire bonding heater block supports the substrate and chip of FIG. 2A.
Figure 5A:
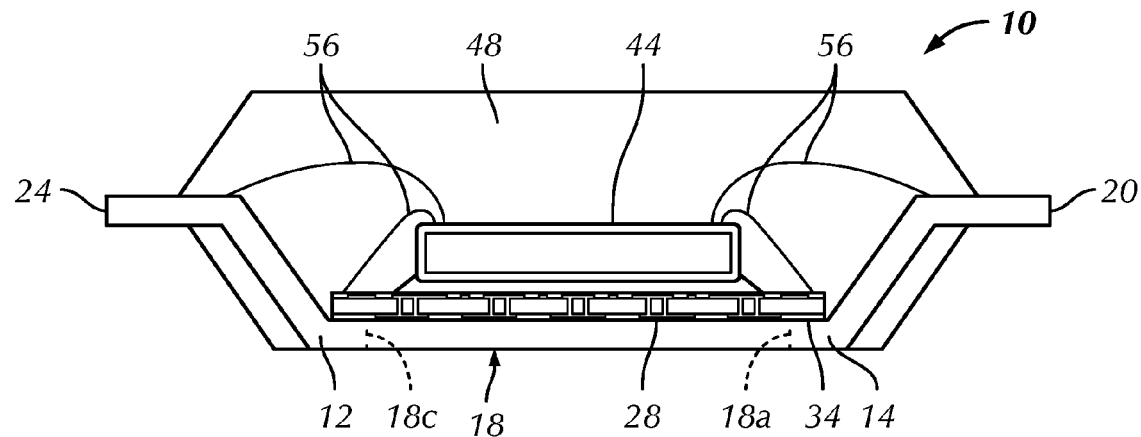
FIG. 5A is a front elevational view of the substrate, lead frame and chip assembly of FIG. 3 with a mold compound secured thereto.
Figure 5B:
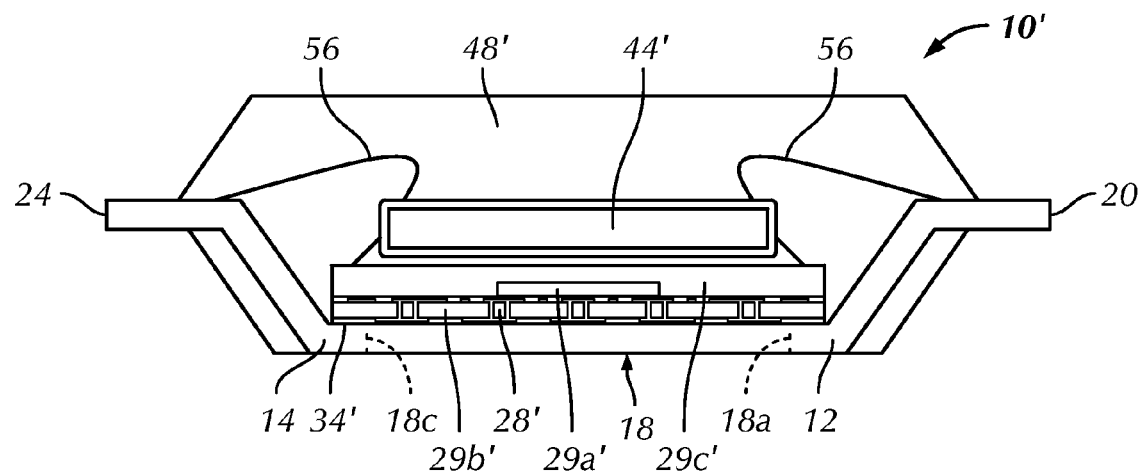
FIG. 5B is a front elevational view of the substrate package and lead frame assembly of FIG. 2B, with a semiconductor chip and a mold compound secured thereto.

Certain terminology is used in the following description for convenience only and is not limiting. The words "right," "left," "lower," "upper," "superior" and "inferior" designate directions in the drawings to which reference is made. The words "inwardly" or "distally" and "outwardly" or "proximally" refer to directions toward and away from, respectively, the geometric center or orientation of the device and related parts thereof. The terminology includes the above-listed words, derivatives thereof and words of similar import.

Briefly stated, a preferred embodiment of the present invention is directed to a semiconductor chip package including a lead frame, a packaged device having a first semiconductor chip attached and electrically connected to a substrate, and a second semiconductor chip secured to a superior side of the packaged device. The lead frame includes a paddle, a plurality of leads surrounding the paddle and a central window through the paddle. The packaged device includes a first mold compound covering at least portions of the first semiconductor chip and the substrate. The packaged device has a base side and a superior side. A peripheral portion of the base side is secured to the paddle and a central portion of the base side is exposed through the central window. The second semiconductor chip is secured to the superior side of the packaged device. The second semiconductor chip is electrically connected to the plurality of leads. A second mold compound covers at least portions of the packaged device, the second semiconductor chip and the lead frame.

In an additional aspect, a preferred embodiment of the present invention is directed to a semiconductor chip package including a lead frame having a paddle, a plurality of leads surrounding the paddle and a central window through the paddle. A substrate has a base side and a superior side. A peripheral portion of the base side is secured to the paddle and a central portion of the base side is exposed through the central window. A semiconductor chip is secured to the superior side of the substrate. The semiconductor chip is electrically connected to the plurality of leads and the substrate. A mold compound covers at least portions of the lead frame and the semiconductor chip.

In another aspect, a preferred embodiment of the present invention is directed to a method of assembling a semiconductor chip package having a lead frame with a paddle and a plurality of leads, a substrate with a base side and a superior side, a semiconductor chip and a mold compound. The base side of the substrate is mounted to the lead frame such that a peripheral portion of the base side faces the paddle and a central portion of the base side is exposed through a central window of the paddle. The semiconductor chip is electrically connected to the substrate and the leads of the lead frame with bond wires. The assembly is encapsulated with the molding compound such that the central portion of the base side is exposed through the central window and distal portions of the leads are exposed through the mold compound.

Referring to FIGS. 1, 1A, 5A and 5B, preferred embodiments of the present invention are directed to a semiconductor chip package, generally designated 10, 10', including a lead frame 12 having a paddle 14, a plurality of leads 16 surrounding the paddle 14 and a central window 18 through the paddle 14. The lead frame 12 is preferably constructed of a copper material but is not so limited and may be constructed of another conductive material that is able to take on the general size and shape of the lead frame 12, withstand the normal operating conditions of the lead frame 12 and perform the functions of the preferred lead frame 12. The central window 18 of the preferred lead frame 12 has a generally square-shape, however, the central window 18 is not so limited. The central window 18 may have nearly any shape that may be formed in the lead frame 12 and preferably in the paddle 14. For example, the central window 18 may have a generally rectangular-shape, a generally circular-shape, a generally oval-shape or other related shapes and/or sizes that may be defined in the lead frame 12.

In the preferred embodiments, the plurality of leads 16 includes a first plurality of leads 20 extending from a first side 12a of the lead frame 12, a second plurality of leads 22 extending from a second side 12b of the lead frame 12 a third plurality of leads 24 extending from a third side 12c of the lead frame 12 and a fourth plurality of leads 26 extending from a fourth side of the lead frame 12. The plurality of leads 12 are not limited to the first, second, third and fourth plurality of leads 20, 22, 24, 26 extending from the first, second, third and fourth sides 12a, 12b, 12c and 12d of the lead frame 12 and are generally so configured for the preferred generally square-lead frame 12 of the first and second preferred embodiments. For example, the plurality of leads 16 may be generally evenly spaced and continuous for a lead frame having a generally circular, oval or otherwise arcuate outer edge. However, for the preferred, generally square or rectangular-shaped lead frame 12, which includes the first, second, third and fourth sides 12a, 12b, 12c and 12d, the lead frame 12 preferably includes the first, second, third and fourth plurality of leads 20, 22, 24 and 26 extending from the sides 12a, 12b, 12c, 12d, respectively. The plurality of leads 16 extending from the sides 12a, 12b, 12c, 12d facilitate increased inputs and outputs or external connections for the preferred semiconductor chip packages 10, 10' on a single package footprint and enhanced package complexity.

In the preferred embodiments, the lead frame 12 has a generally square-shape. The lead frame 12 is not limited to having generally square-shapes and may have nearly any shape that is able to perform the typical functions of the lead frame 12 and withstand the normal operating conditions of the lead frame 12, as is described below. For example, the lead frame 12 may have a generally rectangular-shape, a circular-shape or nearly any shape desired by the designer.

The central window 18 of the preferred embodiments is defined by a first paddle inner wall 18a, a second paddle inner wall 18b, a third paddle inner wall 18c and a fourth paddle inner wall 18d, which define a generally square-shape of the preferred central window 18. The central window 18 is not limited to having the square-shape and may have a rectangular-shape, a circular-shape or nearly any shape desired by the designer to facilitate the function of the preferred semiconductor chip package assemblies 10, 10'.

The preferred central window 18 has a width W measured between the first and third paddle inner walls 18a, 18c and a length L measured between the second and fourth paddle inner walls 18b, 18d. In the preferred embodiments, the width W is generally equal to the length L, thereby defining the generally square-shaped central window 18. As was described, the length L and width W may have different dimensions, such as the length L being greater than the width W or the width W being greater than the length L or both defining a diameter when the central window 18 is circular-shaped, depending upon the desired design and preferences of the designer.

Referring to FIGS. 2A, 2B, 5A and 5B, the first preferred embodiment of the semiconductor chip package 10 includes a bare substrate 28 and the second preferred embodiment of the semiconductor chip package assembly 10' includes a substrate package or packaged device 28'. Like reference numerals are used herein to identify like elements of the first and second preferred embodiments of the semiconductor chip packages 10, 10' with a prime symbol (') used to distinguish the components of the second preferred embodiment. The first and second preferred embodiments of the semiconductor chip packages 10, 10' are generally, similarly constructed with the exception of the bare substrate 28 of the first preferred embodiment and the substrate package or packaged device 28' of the second preferred embodiment.

The preferred semiconductor chip packages 10, 10' include the substrate 28 and the substrate package 28' having a base side 30, 30' and a superior side 32, 32'. A peripheral portion 34, 34' of the base side 30, 30' is secured to the paddle 14 and a central portion 36, 36' of the base side 30, 30' is exposed through the central window 18 in the semiconductor chip packages 10, 10'. The central portion 36, 36' of the substrate 28 and the substrate package 28' is exposed through the central window 18 to provide additional input/output capability for the semiconductor chip packages 10, 10' of the preferred embodiments.

The substrate package or packaged device 28' includes a first semiconductor chip 29a' attached and electrically connected to a substrate 29b' and a first mold compound 29c' covering at least portions of the first semiconductor chip 29a' and the substrate 29b' of the packaged device 28'. The first semiconductor chip 29a' of the packaged device 28' is preferably electrically connected to the substrate 28b' of the packaged device 28' with solder balls 31', but is not so limited and may be electrically connected to the substrate 28b' in nearly any manner that permits electrical connection between the substrate 28b' and the first semiconductor chip 29a' and is able to withstand the normal operating conditions of the semiconductor chip package assembly 10'. For example, the first semiconductor chip 29a' may be connected to the substrate 29b' with bond wires or with bond wires and solder balls 31' or other electrical connection mechanisms and/or methods.

Figure 6:
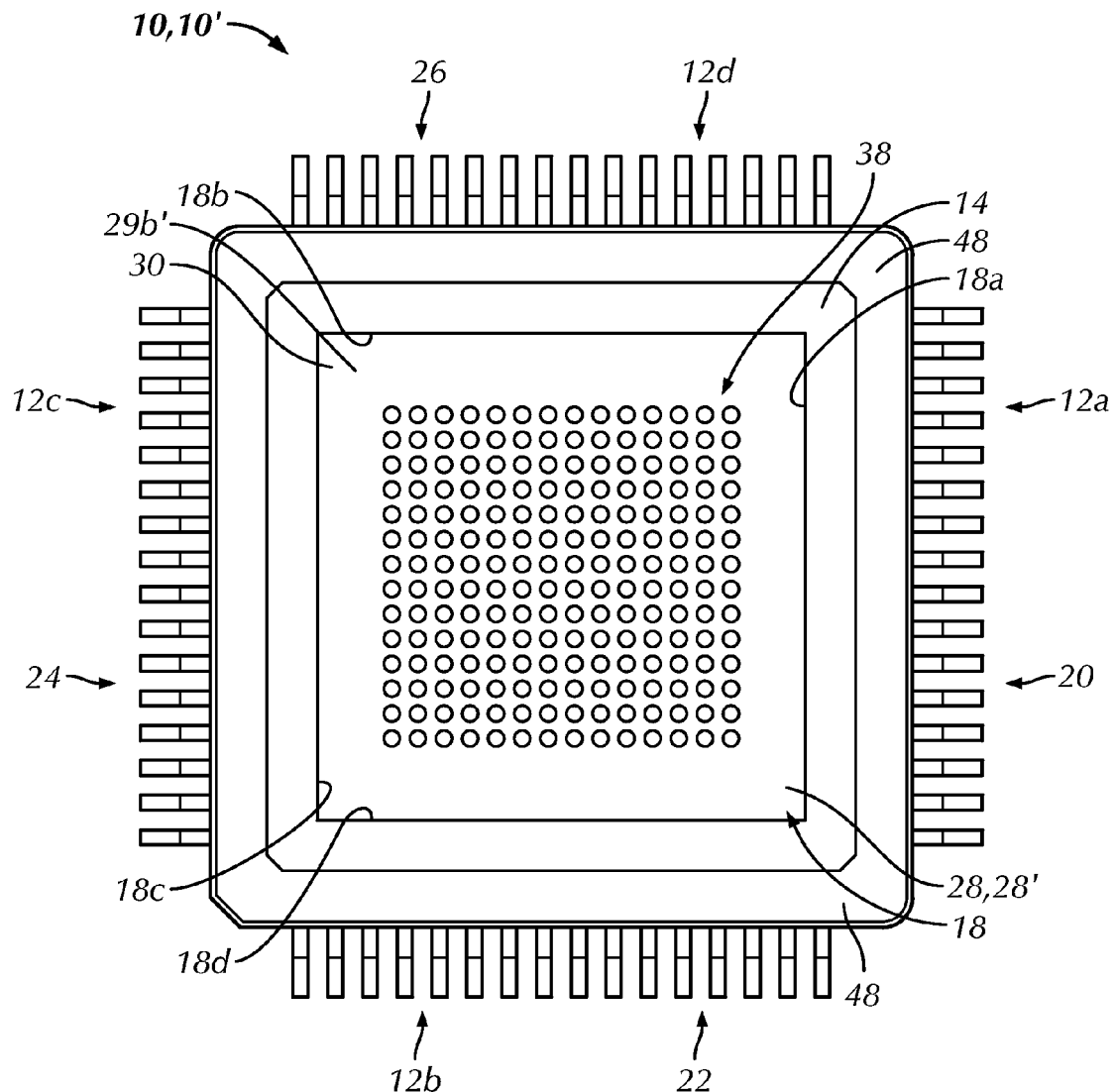
FIG. 6 is a bottom plan view of the semiconductor chip package assembly of FIG. 5A or the semiconductor chip package assembly of FIG. 5B.

Referring to FIG. 6, in the preferred embodiments, the substrate 28 and substrate package 28' may include a substrate ball grid array pad 38 in the central portion 36. Accordingly, the substrate ball grid array pad 38 is exposed through the central window 18 in the semiconductor chip package assemblies 10, 10'. The substrate ball grid array pad 38 provides inputs and outputs for the semiconductor chip package assemblies 10, 10'. The preferred semiconductor chip package assemblies 10, 10' are not limited to including the substrate ball grid array pad 38 exposed through the central window 18 in the central portion 36 and may include nearly any connection element or mechanism that permits input and outputs or external connections to and from the substrate 28 or the substrate package 28' at the central portion 36 of the semiconductor chip package assemblies 10, 10'.

Referring to FIGS. 1A-3, the substrate 28 and substrate package 28' preferably has a substrate peripheral edge 40, 40' and the paddle 14 preferably has a paddle peripheral edge 42. The substrate peripheral edge 40, 40' is approximately the same size as the paddle peripheral edge 42, such that the substrate peripheral edge 40, 40' is positioned at the paddle peripheral edge 42 in the semiconductor chip package assemblies 10, 10'. In the first preferred embodiment, the bare substrate 28 may be cut or sawn such that its substrate peripheral edge 40 is generally the same or has the same size as the paddle peripheral edge 42 for assembly. In the second preferred embodiment, the substrate package 28' is preferably dimensioned or the paddle 14 is dimensioned such that the substrate peripheral edge 40' is substantially the same size as the paddle peripheral edge 42. Accordingly, only the peripheral portion 34, 34' of the base side 30, 30' of the substrate 28 and substrate package 28', respectively, is covered by the paddle 14 and the central portion 36, 36' is exposed through the central window 18. The substrate peripheral edge 40, 40' is not limited to being the same or substantially the same size as the paddle peripheral edge 42, as the substrate peripheral edge 40, 40' and the paddle peripheral edge 42 may be otherwise sized and dimensioned depending upon the specific design of the semiconductor chip packages 10, 10' or the desires of the designer.

The peripheral portion 34, 34' of the base side 30, 30' of the substrate 28 or substrate package 28' is preferably secured to the paddle 14 by adhesive. In the preferred embodiments, the substrate 28 or substrate package 28' is secured to the paddle 14 by an epoxy adhesive or a thermosetting adhesive tape but is not so limited. The peripheral portion 34, 34' may be secured to the paddle 14 by other adhesives that would be known to one having ordinary skill in the art or may be otherwise secured to the paddle 14, such as by clamping, fastening or otherwise securing the substrate 28 or substrate package 28' to the lead frame 12. The preferred adhesive may be comprised of the epoxy adhesive, a thermoset adhesive, a thermoplastic adhesive, adhesive tape or other adhesives that are able to secure the substrate 28 or substrate package 28' to the lead frame 12. In the preferred embodiments, the substrate 28 or substrate package 28' includes multi-layer metal interconnections and a multi-input/output layout.

In the preferred embodiments of the semiconductor chip packages 10, 10', the peripheral portion 34, 34' faces or is in facing engagement with the paddle 14 and the central window 18 is generally bounded by the peripheral portion 34, 34'.

Referring to FIGS. 2A-5B in the preferred embodiments, a semiconductor chip 44 is secured to the superior side 32 of the substrate 28 and a second semiconductor chip 44' is secured to the superior side 32' of the substrate package 28', respectively. The semiconductor chip 44, 44' is electrically connected to the plurality of leads 16 and to the substrate 28 and the substrate package 28', respectively, or at least to some of the leads 16, and to the substrate 28 and the substrate package 28', respectively. In the first preferred embodiment of the semiconductor chip package 10, the semiconductor chip 44 is secured to the bare substrate 28 and is electrically connected thereto and to the lead frame 12. In the second preferred embodiment, the second semiconductor chip 44' is secured to the substrate package 28' such as with a die attach adhesive or an adhesive tape. The semiconductor chip 44 and the second semiconductor chip 44' are preferably connected to the plurality of leads 16 and the substrate 28 or the substrate package 28' by wire bonding, as would be apparent to one having ordinary skill in the art. A wire bonding tool 46 is preferably designed and utilized to support the substrate 28 and the substrate package 28' and any planarity differences between the paddle 14 and the substrate 28 and the substrate package 28' during wire bonding. The wire bonding tool 46 may include a step 46a to support the substrate 28 or the substrate package 28' and the lead frame 12 by engaging the central window 18 during wire bonding to prevent bouncing.

Referring to FIGS. 5A-7, a mold compound 48 is secured to at least portions of the lead frame 12 and the semiconductor chip 44 to protect the chip 44, the substrate 28 and the lead frame 12 in the first preferred embodiment. Likewise, a second mold compound 48' is secured to at least portions of the lead frame 12, the packaged device 28' and the second semiconductor chip 44' to protect the second semiconductor chip 44', the lead frame 12 and the packaged device 28' in the second preferred embodiment. The mold compound 48 and the second mold compound 48' secure the lead frame 12, the substrate 28 or the substrate package 28' and the semiconductor chip 44 or the second semiconductor chip 44' together in the preferred embodiments of the semiconductor chip packages 10, 10'. In the preferred embodiments, the mold compound 48 or second mold compound 48' comprises an epoxy mold compound, but is not so limited and may be comprised of nearly any mold compound that is able to take on the general size and shape of the mold compound 48 or the second mold compound 48' of the preferred embodiments and withstand the normal operating conditions of the mold compounds 48, 48'.

Referring to FIGS. 1-7, in operation, the preferred semiconductor chip packages 10, 10' may be assembled by mounting the base side 30, 30' of the substrate 28 or substrate package 28' to the lead frame 12 such that the peripheral portion 34, 34' of the base side 30, 30' faces or is in facing engagement with the paddle 14 and the central portion 36, 36' of the base side 30, 30' is exposed through the central window 18 of the lead frame 12. The substrate peripheral edge 40, 40' of the substrate 28 or the substrate package 28' is preferably sized to have generally the same dimensions as the paddle peripheral edge 42 of the paddle 14 prior to mounting the substrate 28 or the substrate package 28' to the lead frame 12. The central window 18 is also preferably formed in the lead frame 12 and paddle 14 prior to mounting of the substrate 28 or the substrate package 28'. The substrate 28 or the substrate package 28' is preferably attached to the lead frame 12 using epoxy dispense or thermoset adhesive tape, but is not so limited and may be otherwise secured to the lead frame 12.

In the first preferred embodiment, the substrate 28 serves as a base platform for the semiconductor chip 44, which is preferably an integrated circuit formed on a silicon substrate, as is known in the art, for attachment of the semiconductor chip 44 to the substrate 28. The semiconductor chip 44 is preferably attached to the substrate 28 using epoxy dispense or thermoset adhesive tape. The semiconductor chip 44 is preferably mounted to the substrate 28 before wire bonding.

The semiconductor chip 44 or the second semiconductor chip 44' is then preferably wire bound to the substrate 28 or the lead frame 12, respectively. The step 46a of the wire bonding tool 46 preferably supports the substrate 28 or substrate package 28' during the wire bonding process to prevent bouncing or general movement of the lead frame 12, substrate 28 or substrate package 28' and the chip 44 during wire bonding. The wire bonding tool 46 may be comprised of a wire bonding heater block 46.

Referring to FIGS. 5A-7, the assembly includes or is encapsulated with the mold or molding compound 48, 48' such that the central portion 36, 36' of the base side 30, 30' of the substrate 28 or the substrate package 28' is exposed through the central window 18. The central portion 36, 36' is preferably defined by the length L and width W of the central window 18 to provide input and output through the central window 18. This combination of the plurality of leads 16 and the input and output provided through the central window 18 provide improved wire bonding complexity and wire bonding can be done on a substrate lead finger taking advantage of the substrate 28 or the substrate package's 28' multi-layer metal interconnections and multi-input/output layout. The preferred semiconductor chip packages 10, 10' of the first and second preferred embodiments open the possibility of integrating multi-function silicone or semiconductor chips 44, 44' with higher density wire bonding normally limited by package lead count and the capacity of an inner lead to handle multiple wires on a leaded package platform.

Figure 7:
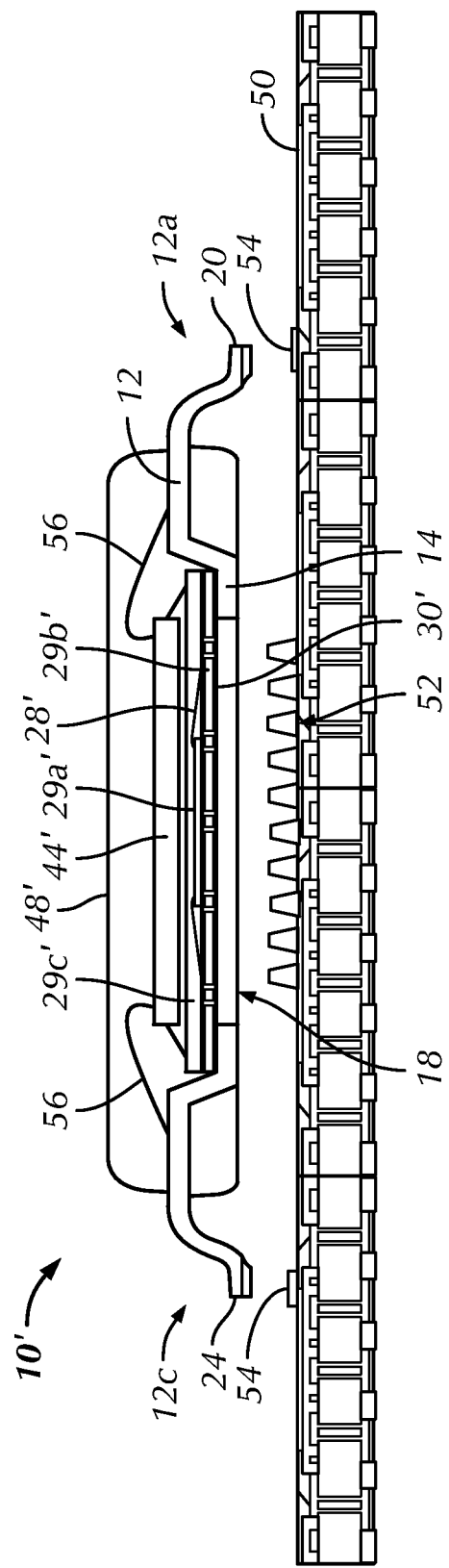
FIG. 7 is a front elevational view of the semiconductor chip package assembly of FIG. 5B, positioned for mounting to a board.

Referring to FIG. 7, the preferred semiconductor chip packages 10, 10' may be mounted to a board 50. The central portion 36, 36' may include the substrate ball grid array pad 38 and the board 50 may include a complimentary ball grid array 52. The ball grid array 52 may be interconnected with the substrate ball grid array pad 38 to provide connection between the substrate 28 or the substrate package 28' and the board 50. In addition, the plurality of leads 16 are preferably mounted to lead interconnect pads 54 of the board 50 to provide further input/output between the preferred semiconductor chip packages 10, 10' and the board 50.

The preferred semiconductor chip packages 10, 10' combine interconnection between the board 50 and the substrate 28 or the substrate package 28' through the central window 18 and interconnection between the board 50 using the plurality of leads 16. Accordingly, the semiconductor chip packages 10, 10' can accomplish multiple or increased input/outputs for the chip packages 10, 10' without a solder ball.

In the preferred embodiments, the adhesive utilized to secure the substrate 28 or the substrate package 28' to the lead frame 12 results in a first cure process and subsequent curing of the semiconductor chip 44 to the substrate 28 or the substrate package 28' results in a second curing process. The preferred semiconductor chip packages 10, 10' are not limited to including multiple curing processes and the components may be assembled, partially bonded and subsequently cured in a single curing process to speed assembly and production.

The semiconductor chips 44, 44' are preferably wire bonded or electrically connected to the substrate 28 or the substrate package 28' in the lead frames 12 with bond wires 56. In the preferred embodiments, multiple bond wires 56 are used to interconnect the semiconductor chip 44 to the plurality of leads 16.

In the preferred embodiments, the ball grid array or solder stud 52 is preferably attached to the board 50 prior to mounting the semiconductor chip packages 10, 10' to the board 50. Pre-attachment of the ball grid array or solder studs 52 to the board 50 facilitates interconnection to the ball grid array pad 38 of the substrate 28 or the substrate package 28'. The ball grid array 52 and substrate ball grid array pad 38 are preferably sized and spaced to match each other, to achieve good interconnection properties and to minimize solder cracking after a reflow process.

The preferred semiconductor chip packages 10, 10' of the first and second preferred embodiments are generally able to increase input/output for the same package footprints compared to conventional packages. These preferred semiconductor chip packages 10, 10' generally enhance package application due to increased package complexity.

The preferred substrate 28, substrate package 28' and semiconductor chips 44, 44' may be arranged and precisely manipulated by tools 58, as would be apparent to one having ordinary skill in the art during the assembly process.

In the claims, the word "comprising," "including" or "having" does not exclude the presence of other elements or steps than those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The drawings provide additional details related to the assembly, system and method not explicitly described in the above text and the operation of the preferred assembly, system and method will be apparent to one having ordinary skill in the art following a review of the present application, including the drawings.

It will be appreciated by those skilled in the art that changes could be made to the embodiments described above without departing from the broad inventive concept thereof. For example, various combinations of the components could be arranged together and assembled from the multiple embodiments to define a semiconductor chip package assembly and multiple preferred semiconductor chip packages could be connected to each other via the board 50. It is understood, therefore, that this invention is not limited to the particular embodiments disclosed, but it is intended to cover modifications within the spirit and scope of the present invention, as defined by the claims.

The invention claimed is:

1. A semiconductor chip package, comprising:
   a lead frame having a paddle, a plurality of leads surrounding the paddle and a central window through the paddle;
   a packaged device including a first semiconductor chip attached and electrically connected to a substrate and a first mold compound covering at least portions of the first semiconductor chip and the substrate, the packaged device having a base side and a superior side, a peripheral portion of the base side secured to the paddle and a central portion of the base side exposed through the central window;
   a second semiconductor chip secured to the superior side of the packaged device, wherein the second semiconductor chip is electrically connected to the plurality of leads; and
   a second mold compound covering the packaged device, the second semiconductor chip and at least portions of the lead frame,
   wherein the central portion of the packaged device includes a substrate ball grid array pad.

2. The semiconductor chip package of claim 1, wherein the first semiconductor chip is electrically connected to the substrate with solder balls.

3. The semiconductor chip package of claim 1, wherein the first semiconductor chip is electrically connected to the substrate with bond wires.

4. The semiconductor chip package of claim 1, wherein the second semiconductor chip is electrically connected to the plurality of leads with bond wires.

5. The semiconductor chip package of claim 1, wherein the peripheral portion of the base side of the packaged device is secured to the paddle with an adhesive.

6. The semiconductor chip package of claim 1, wherein the substrate includes multi-layer metal interconnections and a multi-input/output layout.

7. A semiconductor chip package, comprising:
   a lead frame having a paddle, a plurality of leads surrounding the paddle and a central window through the paddle;
   a packaged device including a first semiconductor chip attached and electrically connected to a substrate and a first mold compound covering at least portions of the first semiconductor chip and the substrate, the packaged device having a base side and a superior side, a peripheral portion of the base side secured to the paddle and a central portion of the base side exposed through the central window, the central portion including a substrate ball grid array pad, and the first semiconductor chip electrically connected to the substrate with first bond wires;
   a second semiconductor chip secured to the superior side of the packaged device, wherein the second semiconductor chip is electrically connected to the plurality of leads with second bond wires; and
   a second mold compound covering the packaged device, the second semiconductor chip, the second bond wires, and at least portions of the lead frame.

8. The semiconductor chip package of claim 7, wherein the peripheral portion of the base side of the packaged device is secured to the paddle with an adhesive.

9. The semiconductor chip package of claim 7, wherein the substrate includes multi-layer metal interconnections and a multi-input/output layout.

* * * * *